United States Patent
Byun et al.

(10) Patent No.: US 11,770,903 B2
(45) Date of Patent: Sep. 26, 2023

(54) METHOD FOR MANUFACTURING CIRCUIT BOARD INCLUDING METAL-CONTAINING LAYER

(71) Applicant: KOREA INSTITUTE OF SCIENCE AND TECHNOLOGY, Seoul (KR)

(72) Inventors: Ji Young Byun, Seoul (KR);
Kwang-Deok Choi, Seoul (KR);
Honguk Cheon, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 17/511,572

(22) Filed: Oct. 27, 2021

(65) Prior Publication Data

US 2022/0132676 A1 Apr. 28, 2022

(30) Foreign Application Priority Data

Oct. 27, 2020 (KR) .................. 10-2020-0140262
Oct. 27, 2020 (KR) .................. 10-2020-0140263

(51) Int. Cl.
*H05K 3/38* (2006.01)
*C23C 18/18* (2006.01)
(Continued)

(52) U.S. Cl.
CPC ......... *H05K 3/388* (2013.01); *C23C 18/1817* (2013.01); *C23C 18/31* (2013.01); *C23C 28/023* (2013.01); *C23F 1/02* (2013.01); *C23F 17/00* (2013.01); *C25D 5/34* (2013.01); *C25D 5/48* (2013.01); *H05K 3/06* (2013.01); *H05K 3/108* (2013.01); *H05K 3/382* (2013.01); *H05K 1/0306* (2013.01); *H05K 1/09* (2013.01);
(Continued)

(58) Field of Classification Search
None
See application file for complete search history.

(56) References Cited

FOREIGN PATENT DOCUMENTS

JP     61-291481 A    12/1986
JP     2003-17837 A    1/2003
(Continued)

OTHER PUBLICATIONS

Young et al. KR20160072980 A, machine translation (Year: 2016).*
Korean Notice of Allowance for KR Application No. 10-2020-0140262 dated Oct. 7, 2021. In conformance with MPEP 609—Concise explanation of the relevance includes issue date of KR OA and references cited therein.
(Continued)

*Primary Examiner* — Wojciech Haske
(74) *Attorney, Agent, or Firm* — CANTOR COLBURN LLP

(57) ABSTRACT

Provided is a method for manufacturing a circuit board including: (a) preparing a mixture of a metal powder, an anti-sintering agent, and an activator; (b) immersing a dielectric substrate in the mixture; (c) forming a metal-containing layer on the surface of the dielectric substrate by heating the mixture under an inert atmosphere or under a reducing atmosphere; (d) forming a first metal layer on the metal-containing layer by electroless plating and forming a second metal layer thereon by electroplating; and (e) forming a metal pattern on the dielectric substrate, wherein the first metal layer includes Cu, Ni, Co, Au, Pd, or an alloy thereof, the second metal layer includes Cu, Ni, Fe, Co, Cr, Zn, Au, Ag, Pt, Pd, Rh, or an alloy thereof, and the method further includes performing heat treatment at least once after step (c).

25 Claims, 16 Drawing Sheets

(51) Int. Cl.
  *C23C 18/31* (2006.01)
  *C23C 28/02* (2006.01)
  *C23F 1/02* (2006.01)
  *C23F 17/00* (2006.01)
  *C25D 5/34* (2006.01)
  *C25D 5/48* (2006.01)
  *H05K 3/06* (2006.01)
  *H05K 3/10* (2006.01)
  *H05K 1/03* (2006.01)
  *H05K 1/09* (2006.01)

(52) U.S. Cl.
  CPC . *H05K 2201/083* (2013.01); *H05K 2203/072* (2013.01); *H05K 2203/0723* (2013.01)

(56) References Cited

FOREIGN PATENT DOCUMENTS

| | | |
|---|---|---|
| KR | 10-1999-0080122 A | 11/1999 |
| KR | 10-2016-0072980 A | 6/2016 |
| KR | 10-1642009 B1 | 7/2016 |

OTHER PUBLICATIONS

Korean Office Action for KR Application No. 10-2020-0140263 dated Jan. 18, 2022. In conformance with MPEP 609—Concise explanation of the relevance includes issue date of KR OA and references cited therein.

\* cited by examiner

FIG. 4

| REACTION TEMPERATURE AND TIME | Ti CONTENT (wt.%) | | | |
|---|---|---|---|---|
| | 4 | 8 | 16 | 32 |
| 900°C – 1 HOUR | | | | |
| 850°C – 1 HOUR | | | | |

METHOD FOR MANUFACTURING CIRCUIT BOARD INCLUDING METAL-CONTAINING LAYER

CROSS-REFERENCE TO RELATED APPLICATION

This application claims the benefit of Korean Patent Application No. 10-2020-0140262 filed on Oct. 27, 2021 and No. 10-2020-0140263 filed on Oct. 27, 2021 in the Korean Intellectual Property Office, the disclosure of which is incorporated herein in its entirety by reference.

BACKGROUND

1. Field

The present disclosure relates to a method for manufacturing a printed circuit board including a metal-containing layer, and more particularly, to a method for manufacturing a circuit board in which the surface of a dielectric substrate is modified using Ti while preventing deterioration of workability caused by partial sintering of Ti powder or in which interfacial adhesive force between an Al-containing or Cr-containing metal layer and a $Si_3N_4$ substrate by forming the metal layer on the $Si_3N_4$ substrate.

2. Description of the Related Art

Aluminum nitride (AlN) and silicon nitride ($Si_3N_4$) having high thermal conductivities of 150 to 250 W/mK and 60 to 90 W/mK, respectively, are applied to parts that require heat dissipation. In order to efficiently remove heat generated in LED chips or power semiconductors, a substrate with high thermal conductivity is required, and AlN and $Si_3N_4$ are representative materials therefor. A metal layer is joined to one surface or both surfaces of such a nitride substrate or metal wiring having a predetermined pattern may be formed thereon. In general, Cu or Cu alloys may be formed on one surface of a substrate by electroless plating or electroplating and patterned to be used as wiring for electrical conduction. In addition, metal layers having various compositions may be formed on one surface of the substrate in accordance with purposes of a circuit board.

In the case where the metal layer is formed on the nitride substrate, one of the problems that are difficult to solve is increased adhesive force between the substrate and the metal layer. Since the nitride and the metal layer are heterogenous materials, adhesive force is often low due to difference in physical properties such as chemical binding structure or thermal expansion coefficient. To solve this problem, a method of forming a metal layer on an appropriately treated surface of a substrate. For example, Korean Patent No. 10-1642009 discloses a method of manufacturing a Cu—AlN composite having strong adhesive force between Cu and AlN by surface-modifying an AlN material using Ti in an inert/reducing atmosphere rather than in a vacuum, and applying Cu thereto sequentially by electroless plating and by electroplating.

However, when an AlN substrate is added to a Ti powder mixture and heat-treated, the Ti powder is sintered to cause several problems. First, since the AlN substrate is in a form covered by a sintered body of Ti powder, the sintered body of Ti powder should be crushed to remove the AlN substrate from the sintered body of Ti powder. During this process, the AlN substrate is also damaged. Therefore, more attention should be paid to recovering the AlN substrate. Second, the AlN substrate is recovered in a state where a part of the sintered body of Ti is attached to the AlN substrate. In the case where a sintered body of Ti powder with a size of several millimeters is attached to the substrate, a subsequent plating process is adversely affected thereby, and thus the sintered body should be removed but the removal is difficult.

In addition, although the method disclosed in the patent document may also be applied to $Si_3N_4$, Ti may be easily oxidized and there is a possibility of ignition after surface modification of the substrate. In addition, Ti powder may be sintered at a high temperature over 800° C. and is expensive. Accordingly, there is a need to develop a metal replacing Ti.

RELATED ART DOCUMENT

Patent Document

Korean Patent No. 10-1642009

SUMMARY

The present disclosure has been proposed to solve the above problems, and an object of the present disclosure is to provide a method for manufacturing a circuit board capable of inhibiting sand burning of Ti powder on a nitride substrate by preventing sintering of the Ti powder and easily separating and recovering the substrate after reaction.

In addition, another object of the present disclosure is to provide a method for manufacturing a circuit board capable of increasing adhesive force between a substrate and a plating layer by surface-modifying the substrate, inhibiting formation of a sintered body on the surface of the substrate, and easily separating and recovering the substrate after reaction. In this case, the same effects of expensive Ti on surface modification of the substrate may be obtained mainly using a metal other than Ti.

However, these problems to be solved are illustrative and the scope of the present disclosure is not limited thereby.

Additional aspects will be set forth in part in the description which follows and, in part, will be apparent from the description, or may be learned by practice of the presented embodiments.

An aspect of the present disclosure provides a method for manufacturing a circuit board including: (a) preparing a mixture of a metal powder, an anti-sintering agent, and an activator; (b) immersing a dielectric substrate in the mixture; (c) forming a metal-containing layer on the surface of the dielectric substrate by heating the mixture under an inert atmosphere or under a reducing atmosphere; (d) forming a first metal layer on the metal-containing layer by electroless plating and forming a second metal layer thereon by electroplating; and (e) forming a metal pattern on the dielectric substrate, wherein the first metal layer includes Cu, Ni, Co, Au, Pd, or an alloy thereof, the second metal layer includes Cu, Ni, Fe, Co, Cr, Zn, Au, Ag, Pt, Pd, Rh, or an alloy thereof. In this regard, the method may further include performing heat treatment at least once after step (c).

According to an aspect of the present disclosure, the anti-sintering agent is selected from the group consisting of $Al_2O_3$, $TiO_2$, TiN, TiC, MgO, and any combination thereof in a powder form.

According to an aspect of the present disclosure, the anti-sintering agent is a $Ti_xO_y$ (x≥y) powder.

According to an aspect of the present disclosure, the mixture includes 2% to 32% of the Ti powder, 0.04% to 0.64% of the activator, and the remainder of the anti-sintering agent.

According to another aspect of the present disclosure, a method for manufacturing a circuit board includes: (a) preparing a mixture of an Al-containing or Cr-containing metal powder, $Al_2O_3$ and an activator; (b) immersing an $Si_3N_4$ substrate in the mixture; (c) forming an Al-containing or Cr-containing layer on the surface of the $Si_3N_4$ substrate by heating the mixture under an inert atmosphere or under a reducing atmosphere; (d) forming a first metal layer on the Al-containing or Cr-containing layer by electroless plating and forming a second metal layer thereon by electroplating; and (e) forming a metal pattern on the $Si_3N_4$ substrate, wherein the first metal layer includes Cu, Ni, Co, Au, Pd, or an alloy thereof, the second metal layer includes Cu, Ni, Fe, Co, Cr, Zn, Au, Ag, Pt, Pd, Rh, or an alloy thereof. In this regard, the method may further include performing heat treatment at least once after step (c).

According to an aspect or another aspect of the present disclosure, the method may further include heat-treating the substrate on which the metal pattern is formed after step (e).

According to an aspect or another aspect of the present disclosure, the method may further include heat-treating the substrate on which the second metal plating layer is formed after step (d) and before step (e).

According to an aspect or another aspect of the present disclosure, after heat-treating the substrate after the electroless plating in step (d), the second metal is electroplated.

The second metal layer according to an aspect or another aspect of the present disclosure may include an Fe—Ni alloy layer or an Ni—Cr alloy layer.

The Fe—Ni alloy layer may include an INVAR alloy.

The Ni—Cr alloy layer may include a nichrome alloy.

The second metal layer according to an aspect or another aspect of the present disclosure may include a soft magnetic thin-film including at least one of Fe, Ni, and Co.

According to an aspect of the present disclosure, the heating temperature may be from 700 to 1200° C.

According to another aspect of the present disclosure, the heating temperature may be from 500 to 1200° C.

The activator according to an aspect or another aspect of the present disclosure may include at least one selected from the group consisting of a chloride, a fluoride, and an iodide.

At least one selected from the group consisting of NaCl, KCl, LiCl, $CaCl_2$, $BaCl_2$, and $NH_4Cl$ may be used as the chloride, at least one selected from the group consisting of NaF, KF, LiF, $MgF_2$, $CaF_2$, $BaF_2$, and $NH_4F$ may be used as the fluoride, and at least one selected from the group consisting of NaI, KI, LiI, $MgI_2$, $CaI_2$, $BaI_2$, and $NH_4I$ may be used as the iodide.

According to an aspect of the present disclosure, the amount of the activator may be from 0.1 to 20 parts by weight based on 100 parts by weight of the Ti powder 100 parts by weight.

According to another aspect of the present disclosure, the amount of the activator may be from 0.1 to 20 parts by weight based on 100 parts by weight of the Al or Cr powders.

A heat treatment time according to an aspect and another aspect of the present disclosure may be from 0.1 minutes to 120 minutes.

The heat treatment temperature according to an aspect and another aspect of the present disclosure may be from 400 to 1000° C.

The heat treatment time according to an aspect and another aspect of the present disclosure may be from 0.1 minutes to 120 minutes.

The heat treatment according to an aspect and another aspect of the present disclosure may be performed under a reducing atmosphere.

According to an aspect of the present disclosure, the dielectric substrate may be a nitride.

The nitride may include one of AlN, $Si_3N_4$ and BN.

According to another aspect of the present disclosure, a method for manufacturing a circuit board includes: (A) preparing a mixture of an Al-containing or Cr-containing metal powder, $Al_2O_3$ and an activator; (B) immersing an $Si_3N_4$ substrate in the mixture; (C) forming an Al-containing or Cr-containing layer on the surface of the substrate by heating the mixture under an inert atmosphere or under a reducing atmosphere; and (D) joining a metal plate to the Al-containing or Cr-containing layer by brazing, wherein the metal plate includes Al, Cu, Fe, Ni, Co, Cr, Zn, Au, Pd, or an alloy thereof.

BRIEF DESCRIPTION OF THE DRAWINGS

These and/or other aspects will become apparent and more readily appreciated from the following description of the embodiments, taken in conjunction with the accompanying drawings in which:

FIG. 4 shows anti-sintering effects obtained by adding $Al_2O_3$ powder as an anti-sintering agent according to an embodiment of the present disclosure;

DETAILED DESCRIPTION

Figure 1A:
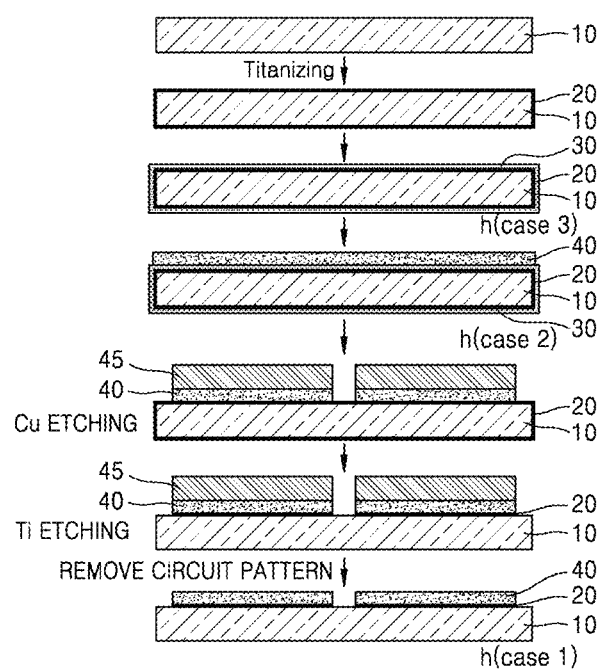
FIG. 1A and FIG. 1B are a process flow diagram illustrating a method for forming a metal pattern on a dielectric substrate according to an embodiment of the present disclosure.

The present disclosure will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, shapes and sizes of elements may be exaggerated for clarity and like reference numerals in the drawings denote like elements.

Hereinafter, embodiments of the present disclosure will be described in detail with reference to the accompanying drawings.

A method for manufacturing a circuit board according to the present disclosure includes: (a) preparing a mixture of a metal powder, an anti-sintering agent, and an activator; (b) immersing a dielectric substrate in the mixture; (c) forming a metal-containing layer on the surface of the dielectric substrate by heating the mixture under an inert atmosphere or under a reducing atmosphere; (d) forming a first metal layer on the metal-containing layer by electroless plating and forming a second metal layer thereon by electroplating; and (e) forming a metal pattern on the dielectric substrate, wherein the first metal layer includes Cu, Ni, Co, Au, Pd, or an alloy thereof, the second metal layer includes Cu, Ni, Fe, Co, Cr, Zn, Au, Ag, Pt, Pd, Rh, or an alloy thereof, and heat treatment is further performed at least once after step (c).

Figure 1B:
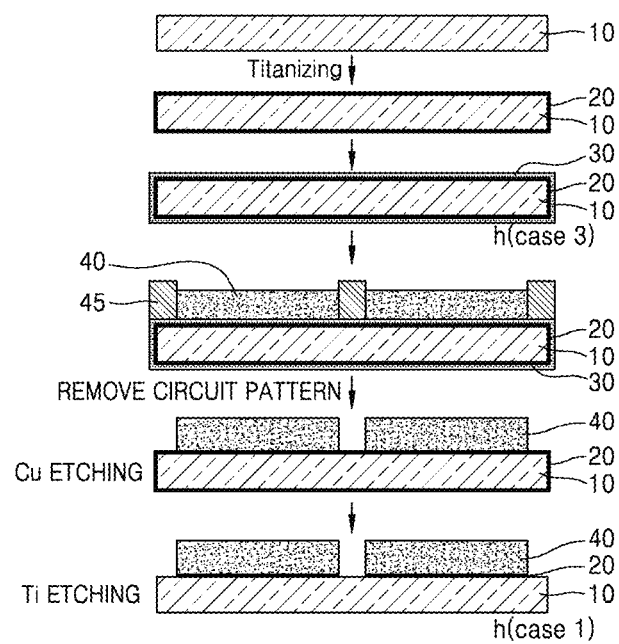

FIG. 1A and FIG. 1B are process flow diagrams illustrating a method for forming a metal pattern on a dielectric substrate according to an embodiment of the present disclosure. In the method for manufacturing a circuit board according to an embodiment of the present disclosure, the metal powder is a Ti powder and the metal-containing layer is a Ti-containing layer 20.

Referring to FIG. 1, the method for manufacturing a circuit board according to an embodiment of the present disclosure starts with a step of forming a Ti-containing layer 20 on the surface of a dielectric substrate 10. The dielectric substrate 10 is preferably a nitride. For example, the dielectric substrate 10 may include one of AlN, $Si_3N_4$, and BN.

The Ti-containing layer 20 may be formed by immersing the dielectric substrate 10 in a mixture of a titanium (Ti) powder, an anti-sintering agent, and an activator and heating the mixture under an inert atmosphere or under a reducing atmosphere. A gaseous compound generated by a reaction of titanium (Ti) with the activator migrates onto the surface of the dielectric substrate 10, and titanium (Ti) metal formed on the surface of the substrate reacts with a component of the substrate to form the Ti-containing layer 20.

As the activator, at least one selected from the group consisting of a chloride, a fluoride, and an iodide may be used. As the chloride, at least one selected from a chloride of an alkali metal such as LiCl, NaCl, and KCl, and a chloride of an alkali earth metal such as $CaCl_2$ and $BaCl_2$, and $NH_4Cl$ may be used. As the fluoride, at least one selected from the group consisting of NaF, KF, LiF, $CaF_2$, $BaF_2$, and $NH_4F$ may be used. As the iodide, at least one selected from the group consisting of NaI, KI, LiI, $MgI_2$, $CaI_2$, $BaI_2$, and $NH_4I$ may be used.

In an embodiment of the present disclosure, the activator may be used in an amount of 0.1 to 10 parts by weight based on 100 parts by weight of Ti. When the amount of the activator is less than 0.1 parts by weight, a Ti-containing gaseous phase generated via a reaction with Ti is low. When the amount of the activator is greater than 10 parts by weight, inconvenience may be caused in post-processing.

In an embodiment of the present disclosure, the inert atmosphere may be prepared using at least one of argon gas and nitrogen gas and the reducing atmosphere may be prepared using at least one of hydrogen gas and ammonia gas. In an embodiment of the present disclosure, when Ti is precipitated on the surface of the nitride (AlN, $Si_3N_4$, or BN) and induces a reaction, a Ti-containing nitride and an alloy phase containing Ti and Al (or Si) are generated. For example, when the power mixture including Ti powder and a chloride activator is heated, Ti reacts with the chloride activator to form a Ti-chloride-containing gaseous phase. The Ti-chloride-containing gaseous phase is brought into contact with the surface of the nitride to be precipitated into Ti, and the precipitated Ti reacts with Al (or Si or B) and nitrogen (N), which are components of AlN (or $Si_3N_4$ or BN) to form an alloy with a Ti-containing nitride such as TiN, $AlTi_2N$, $Ti_3Al_2N_2$, $AlTi_3$, AlTi, and $Al_3Ti$. That is, the Ti chloride in the gaseous phase reacts with AlN in the solid phase to form a coating layer on the surface of AlN. Since the Ti-containing layer 20 including a Ti chloride and a Ti nitride is formed via such gas-solid phase reaction, the Ti-containing layer 20 may be uniformly formed on the surface of AlN (or $Si_3N_4$ or BN). In the case of using an $Si_3N_4$ nitride substrate, compounds such as TiN, $Ti_5Si_3$, TiSi, and $TiSi_2$ may be generated as reactants.

Figure 2:
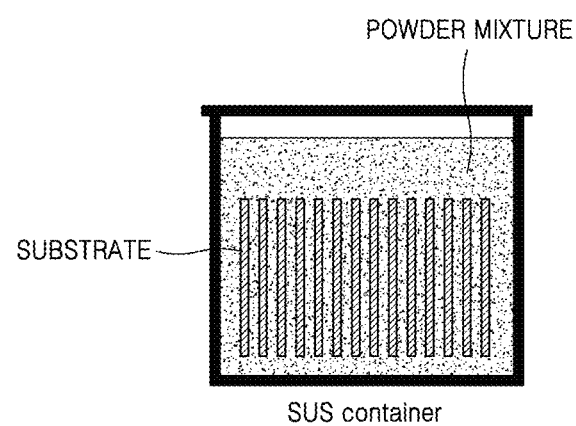
FIG. 2 is a schematic diagram illustrating a process of forming a Ti-containing layer on a dielectric substrate in a stainless-steel container according to an embodiment of the present disclosure.

FIG. 2 is a schematic diagram illustrating a process of forming a Ti-containing layer on a dielectric substrate in a stainless-steel container according to an embodiment of the present disclosure.

Referring to FIG. 2, a substrate is immersed in a mixture of a Ti powder, an anti-sintering agent, and an activator and heated under an inert atmosphere or under a reducing atmosphere to form a Ti-containing layer on the surface of the substrate. In this case, an anti-sintering agent is added thereto to prevent the Ti powder particles from being sintered and increase adhesive force with a plating layer.

The anti-sintering agent is a material having inert properties with little reactivity at a high temperature, and alumina ($Al_2O_3$), $TiO_2$, TiN, TIC, or MgO powder may be used therefor. In addition, an oxide, e.g., $Ti_xO_y$ (x≥y) powder, may be used as the anti-sintering agent as will be described later.

When the anti-sintering agent is not added to the powder mixture, the Ti-activator powder mixture used to form the Ti-containing layer on the nitride substrate is sintered making it difficult to separate the nitride substrate after the reaction. Also, a sand burning phenomenon in which the sintered Ti powder is firmly adhered to the surface of the nitride substrate may occur. In the case where a metal such as Cu/Ni is formed thereon by electroless plating, an electroless plating layer having a very rough surface is formed by the sand burning of Ti powder which may be determined as defective.

Figure 3A:
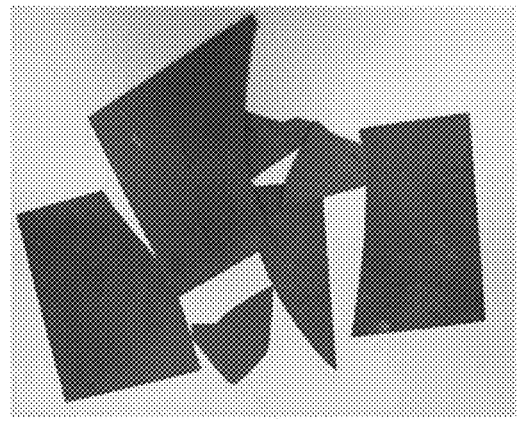
FIG. 3A and FIG. 3B show cracks of a substrate and projections of powder in the case where a sintered body of Ti is formed during a heat treatment process.
Figure 3B:
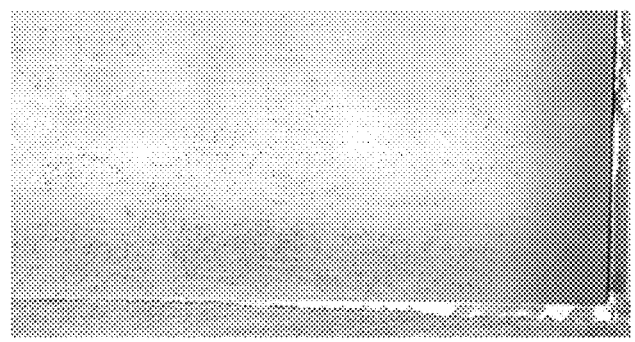

In the case where a Ti-sintered body is formed on the surface of the dielectric substrate, as shown in FIG. 3A, the substrate easily breaks while the sintered body is separated from the substrate so that a recovery rate decreases. In addition, activation of the Ti powder may easily cause ignition and oxidation of the Ti powder makes reuse thereof difficult. Therefore, there is a problem that cooling the reactants after termination of the reaction takes a long time. In addition, as shown in FIG. 3B, projections of powder are formed on the surface of the substrate, thereby reducing adhesion with the plating layer.

Therefore, in an embodiment of the present disclosure, sintering of the Ti powder may be suppressed and adhesion with the plating layer may be significantly increased by adding the anti-sintering agent to the Ti powder mixture. In an embodiment of the present disclosure, when alumina ($Al_2O_3$) is used as the anti-sintering agent, Ti may react with $Al_2O_3$ to generate AlTi, TiO, $Ti_2O$, or the like. As such, since particles having an unintended composition may be generated by reaction between the anti-sintering agent and the Ti powder, TiN and TiC may be used in consideration of reusing the anti-sintering agent.

In an embodiment of the present disclosure, when $TiO_2$ is repeatedly used as the anti-sintering agent, Ti is oxidized via a reaction with $TiO_2$ to produce various Ti sub-oxides such as $Ti_2O_3$, TiO, $Ti_2O$, and $Ti_3O$. This is because Ti reacts with $TiO_2$. For example, in the case where a nitride substrate is immersed in a powder mixture including Ti, $TiO_2$, and a chloride activator and reacted at a high temperature, Ti reacts with the activator to generate various types of Ti chloride gases which move to the nitrate substrate simultaneously moving to the surface of the $TiO_2$ powder. For this reason, Ti is precipitated on the surface of the $TiO_2$ powder and reacts with $TiO_2$ to produce Ti sub-oxides. That is, $TiO_2$ has a disadvantage of reducing availability of Ti via reaction with Ti. Therefore, an anti-sintering agent that does not react with Ti or has a very low reactivity with Ti is required. In order to solve this problem of consuming Ti via reaction between $TiO_2$ and Ti, $Ti_xO_y$ ($x \geq y$) powder may be added to the initial powder mixture as an anti-sintering agent. For example, TiO, $Ti_2O$, $Ti_3O$, $Ti_6O$, and the like may be used. When the Ti content is stoichiometrically equal to or greater than the oxygen (O) content, reaction with Ti does not easily occur, thereby providing excellent anti-sintering effects.

Subsequently, an electroless plating layer 30 including Cu, Ni, Co, Au, Pd, or an alloy thereof and an electroplating layer 40 including Cu, Ni, Fe, Co, Cr, Zn, Au, Ag, Pt, Pd, Rh, or an alloy thereof are sequentially formed on the Ti-containing layer 20. In the specification of the present disclosure, the sequentially stacked electroless plating layer 30 and electroplating layer 40 are collectively referred to as 'plating layer'. The plating layer on the dielectric substrate 10 coated with the Ti-containing layer 20 may be in a form covering the entire dielectric substrate 10 or may have a desired pattern. Wiring corresponding to a given pattern may be formed by an etching process or a semi-additive process.

According to the technical idea of the present disclosure, at least one heat treatment is performed after the Ti-containing layer 20 is formed to increase binding force between the Ti-containing layer 20 and the plating layers 30 and 40 by mutual diffusion. For example, the heat treatment may be performed during a process of forming the plating layers 30 and 40 or after forming the metal pattern using the plating layers 30 and 40.

FIG. 1A and FIG. 1B schematically show methods of manufacturing circuit boards by the etching process and the semi-additive process, respectively.

The etching process of FIG. 1A is used when the plating layers are not thick and a metal pattern is obtained by attaching a desired film of the circuit pattern 45 to the electroless plating-electroplating layers and removing portions other than the circuit pattern 45 by etching. The heat treatment process to further improve adhesive force between the Ti-containing layer 20 and the plating layer may be introduced after the metal pattern is obtained (case 1) or before etching the plating layers, i.e., before attaching the film of the circuit pattern 45 (case 2). Also, after the first metal layer is formed by electroless plating and heat-treated, the second metal layer may be formed by electroplating (case 3).

The purpose of introducing the heat treatment process is to increase binding force between the plating layers 30 and 40 and the Ti-containing layer 20 by mutual diffusion, and thus the heat treatment process may be applied at any stage of the entire process.

According to the semi-additive process of FIG. 1B, after the Ti-containing layer 20 and the electroless plating layer 30 are formed on the dielectric substrate 10, the circuit pattern 45 is attached to a region of the dielectric substrate 10 provided with the electroless plating layer 30. Subsequently, the electroplating layer 40 is formed on a non-circuit pattern region, and the previously formed circuit pattern 45 is removed, and then the dielectric substrate 10 formed on the surface of the dielectric substrate 10 is etched to form the metal pattern. The heat treatment process may also be introduced at any appropriate stage of the semi-additive process in accordance with the principle.

In an embodiment of the present disclosure, layer in the process of forming the metal pattern, the etching of the plating may be performed using any known etchant. In addition, any known etchant capable of etching Ti may be used in the etching of the Ti-containing layer 20.

In an embodiment of the present disclosure, a heat treatment temperature may be from 400 to 1000° C. Since a thickness of the Ti-containing layer 20 is generally about several micrometers (μm), the heat treatment time may preferably be from 0.1 minutes to 600 minutes, more preferably, from 0.1 minutes to 120 minutes. By adjusting the heat treatment temperature or time, the degree of mutual diffusion may be controlled. In this case, the heat treatment may be performed under a weakly reducing atmosphere to inhibit oxidation of the metal.

In an embodiment of the present disclosure, the electroless plating layer 30 or the first metal layer 30 formed by electroless plating may include one of Cu, Ni, Co, Au, or Pd or an alloy thereof. The electroless plating may be performed by any known method, e.g., a method of using Pd as a catalyst. Conditions for the electroless plating may be appropriately adjusted in accordance with a required thickness for the plating layer.

After the first metal layer is formed, the electroplating layer 40 or the second metal layer 40 is formed by electroplating. The second metal layer 40 may include Cu, Ni, Fe, Co, Cr, Zn, Au, Ag, Pt, Pd, Rh, or an alloy thereof. The electroplating of the second metal layer 40 may also be performed by any known method.

The second metal layer 40 including alloys having various compositions in accordance with purposes of the circuit board may be used as an example of the present disclosure.

In an embodiment of the present disclosure, when an Fe—Ni alloy layer is formed as the second metal layer 40, a thermal expansion coefficient may be lowered to a level of a ceramic material by adjusting the composition of the alloy layer, and the second metal layer 40 may be used as a high-temperature heating material. For example, an Fe—Ni alloy layer having an INVAR alloy composition including 36 wt % of Ni, the remainder of Fe, and inevitable impurities is formed, a circuit board including a metal layer having a very low thermal expansion coefficient may be manufactured. As another example, the Fe—Ni alloy layer may be used as a high-temperature heating material.

In an embodiment of the present disclosure, when a Ni—Cr alloy layer is formed as the second metal layer 40, the second metal layer 40 may be used as a heating material. For example, a nichrome alloy layer including 80 wt % of Ni and 20 wt % of Cr is used as the substate, it may be used as a planar heater.

In an embodiment of the present disclosure, by locally forming the Fe—Ni alloy layer or the Ni—Cr alloy layer, which generate heat, on a portion of the circuit board as the second metal layer 40, the portion may be locally heated. Such a circuit board capable of locally heating may be applied to constitute a sensor circuit that operates at a high temperature. For example, by forming Ni—Cr alloy wiring in the middle of Cu wiring, heat may be generated only at the portion of the Ni—Cr wiring.

In an embodiment of the present disclosure, a soft magnetic thin-film including at least one of Fe, Ni, and Co is formed as the second metal layer 40 so as to be used for various purposes as a magnetic element or a magnetic sensor.

Hereinafter, the present disclosure will be described in more detail with reference to the following examples. However, the following examples are merely presented to exemplify the present disclosure, and the scope of the present disclosure is not limited thereto.

EXAMPLES

Example 1

$Al_2O_3$

In a stainless steel (SUS) container, a mixture including 2 to 32 wt % of Ti powder, 2 wt % (relative to Ti) of $NH_4Cl$ powder and the remainder of $Al_2O_3$ powder was prepared. An AlN substrate was immersed in the mixture and heated under an Ar gas atmosphere at a temperature of 850° C. to 1000° C. for 1 hour to 4 hours. Dimensions of the AlN substrate used herein were 10 cm in width and length, respectively, and 1 mm in thickness. 5 sheets of the AlN substrate were used in one test. After the AlN substrate was titanized, an electroless Cu plating layer was formed using an electroless plating solution including EDTA.

Example 2

$TiO_2$ 5 sheets of the AlN substrate were immersed in a mixture having a composition of 16% Ti-0.32% $NH_4Cl$-83.68% $TiO_2$ and heated under an Ar gas atmosphere at a temperature of 900° C. to 1000° C. for 1 hour to 4 hours. In order to test whether $TiO_2$ is reusable, 5 sheets of the AlN substrate were immersed in an initial powder mixture and reacted at 900° C. for 1 hour. The powder mixture obtained therefrom was reused. Ti and $NH_4Cl$ powder were added in the same amounts as those used in the initial powder mixture to the previously used mixture, and 5 sheets of the AlN substrate were immersed therein and a titanizing test was performed at 900° C. for 1 hour. This test was repeated three times to evaluate the possibility of reusing the powder mixture. After titanizing the AlN substrate, a Cu plating layer was formed.

Example 3

TiN and TiC

A reaction was performed in the same manner as in Example 2, except that TiN and TiC were added instead of $TiO_2$. In order to evaluate whether TiC is reusable, 5 sheets of the AlN substrate were immersed in the initial powder mixture including TiC (16% Ti-0.32% $NH_4Cl$-83.68% $TiO_2$) and reacted at 900° C. for 1 hour. The powder mixture obtained therefrom was reused. In the second test, Ti powder and $NH_4Cl$ powder were added thereto but the amounts of Ti powder and $NH_4Cl$ powder was 5/16 of the amounts of Ti powder and $NH_4Cl$ powder used to prepare the initial powder mixture. 5 sheets of the AlN substrate were titanized at 900° C. for 1 hour using the powder mixture having a new composition prepared as described above. The amounts of Ti powder and $NH_4Cl$ powder additionally added in the third test were 5/16 which is the same as those used in the second test, and the amounts of Ti powder and $NH_4Cl$ powder in the powder mixture were 2/16 in the fourth test, 9/16 in the fifth test, and 5/16 in the sixth test. 5 sheets of the AlN substrate were used in the third and fourth tests, 12 sheets of the AlN substrate were used in the fifth test, 6 sheets of the AlN substrate and 4 sheets of an $Si_3N_4$ substrate were used in the sixth test for titanizing. The conditions for titanizing were 900° C. and 1 hour.

Hereinafter, performance of the circuit boards of Examples 1 to 3 above will be described with reference to FIGS. 4 to 10.

Experimental Example 1

Figure 5:
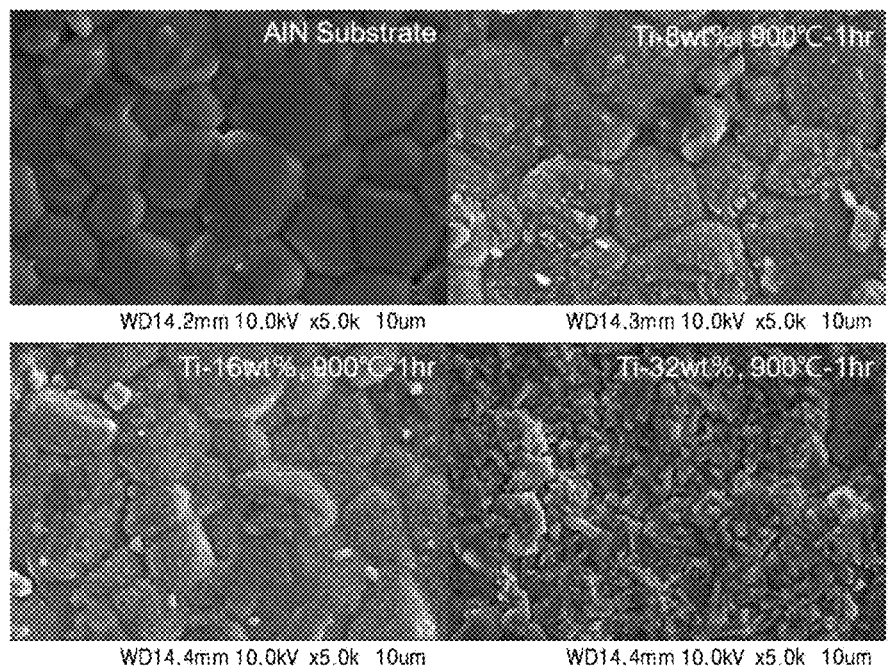
FIG. 5 shows surface images of substrates according to Ti content in the case where $Al_2O_3$ powder is added as an anti-sintering agent according to an embodiment of the present disclosure.

The anti-sintering effects on the Ti powder were observed after titanization according to Example 1 and results are shown in FIG. 4. Referring to FIG. 4, it was confirmed that anti-sintering effects were obtained in the case where the amount of the Ti powder was less than 32%. It is considered that $Al_2O_3$ inhibited sintering of Ti by interfering contact between particles of the Ti powder. When the amount of Ti powder is at a high level of 32 wt %, it is considered that the particles of the Ti powder are brought into contact with each other, leading to local sintering of the Ti powder. As a result of analyzing the surface of the titanized AlN substrate by X-ray diffraction analysis, it was confirmed that the Ti-containing layer such as TiN and $Al_3TiN$ was formed. FIG. 5 shows SEM images of the surfaces of the AlN substrates titanized at 900° C. for 1 hour. Although products of the reaction were observed on the surface, sand burning of the Ti powder was not observed. It was confirmed that the surface of the reaction had fine irregularities.

An adhesion test was performed on the electroless Cu plating layer after the titanizing treatment according to Example 1 as described above, and the results are shown in Table 1. 10×10 lattices each having a size of 1 mm×1 mm were formed on the substrate. After a tape is applied to the electroless Cu plating layer of the substrate and removed therefrom, the number of remaining lattices was observed and assessed on a 0B~5B scale. (5B: The cut surface is dean and no lattice is removed. 4B: Small pieces of the coating are separated at intersections (less than 5% of lattice area). 3B: Small pieces of the coating are separated at intersections of cut portions along corners (5 to 15% of lattice area). 2B: Edges of a cut surface of the coating and parts of lattices are separated (15 to 35% of lattice area). 1B: Edges of a cut surface of the coating are peeled off in a large area and lattices are separated (35 to 65% of lattice area). 0B: More peeled off and more separated than 1B (65% or more of lattice area)).

TABLE 1

| Reaction temperature-time | Ti content in powder mixture (wt %) | Adhesive strength of tape (N/cm) | |
|---|---|---|---|
| | | 2.5 | 44 |
| 850° C.-1 hour | 4 | 5B | 1B |
| | 8 | 5B | 1B |
| | 16 | 5B | 1B |
| | 32 | 5B | 1B |
| 900° C.-1 hour | 2 | 5B | 5B |
| | 4 | 5B | 5B |
| | 8 | 5B | 5B |
| | 6 | 5B | 5B |
| | 32 | 5B | 5B |
| 900° C.-4 hours | 16 | 5B | 5B |
| 1,000° C.-1 hour | 16 | 5B | 5B |
| 1,000° C.-4 hours | 16 | 5B | 5B |

Table 1 shows evaluation results showing degrees of adhesive force of the electroless Cu plating layer to the AlN substrate. Referring to effects of reaction temperature and time, it was confirmed that the electroless Cu plating layers were firmly adhered without being peeled off even in the test using a tape having an adhesive strength of 44 N/cm except for the conditions of 850° C. and 1 hour. Meanwhile, the layers were not peeled off in the test using a tape having an adhesive strength of 2.5 N/cm even under the conditions of 850° C. and 1 hour. As described above, it was confirmed that, by using $Al_2O_3$ powder, titanization may be performed without sintering of the powder and an electroless Cu plating layer having high interfacial adhesive force may be formed on the AlN substrate.

Figure 6:
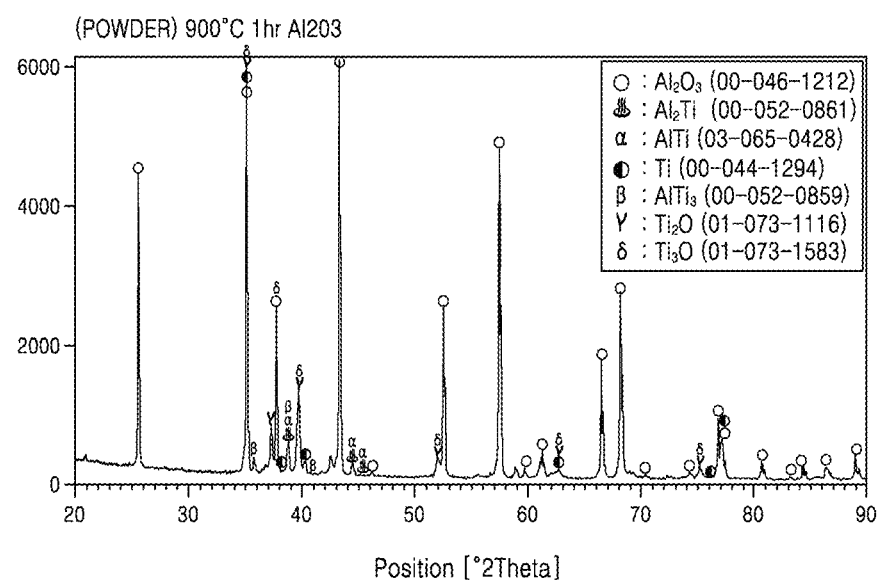
FIG. 6 shows types of materials formed on a substrate in the case of mixing Ti powder and $Al_2O_3$ powder according to an embodiment of the present disclosure.

FIG. 6 shows X-ray diffraction analysis results of the powder mixture used in titanization according to Example 1. The initial powder mixture included 16 wt % of Ti. After titanizing at 900° C. for 1 hour, a small amount Ti was observed and small amounts of AlTi, $AlTi_3$, TiO, and $Ti_2O$ phases were also observed. This indicates that a small amount of $Al_2O_3$ was also titanized in the mixture. That is, $Al_2O_3$ reacts with Ti to generate AlTi, $AlTi_3$, TiO, and $Ti_2O$ phases. Another reason for generation of the Ti sub-oxides is oxidation by oxygen present in the reactor. This will be described in more detail in Experimental Example 4. Since the degree of reaction between $Al_2O_3$ and Ti is insignificant, it is determined that the reaction powder may be reused.

Experimental Example 2

An adhesion test was performed on the Cu plating layer formed on the AlN substrate when using $TiO_2$ as an anti-sintering agent according to Example 2, and the results are shown in Table 2. In Table 2, strong adhesive force of the Cu plating layer was confirmed. It was confirmed that powder was not sintered after reaction.

TABLE 2

| Reaction temperature-time | Ti content in powder mixture (wt %) | Adhesive strength of tape (N/cm) | |
|---|---|---|---|
| | | 2.5 | 44 |
| 900° C.-1 hour | 16 | 5B | 5B |
| 900° C.-4 hours | 16 | 5B | 5B |
| 1,000° C.-1 hour | 16 | 5B | 5B |
| 1,000° C.-4 hours | 16 | 5B | 5B |

As a result of analyzing the powder obtained after repeated tests using $TiO_2$ powder in Example 2 above, $Ti_2O_3$ and a trace of TiO were detected in the initial powder mixture. When initial powder mixture was supplemented with Ti and $NH_4Cl$ once, $TiO:Ti_2O_3$ (3:1) and a small amount of $Ti_2O$ were detected. In this case, as a result of forming an electroless Cu plating layer on the AlN substrate and evaluating interfacial adhesive force by a tape test, interfacial adhesive force was determined as 5B in both cases of 2.5 N/cm and 44 N/cm. When the mixture was supplemented with Ti and $NH_4Cl$ twice, $TiO:Ti_2O$ (3:1) and a small amount of $Ti_3O/Ti$ were detected. When the mixture was supplemented with Ti and $NH_4Cl$ three times, $TiO:Ti_2O$ (3:2) and a small amount of $Ti_3O/Ti$ were detected. In both cases, interfacial adhesive force between Cu and AlN was determined as 5B in the adhesion test using tapes having adhesive strengths of 2.5 N/cm and 44 N/cm, respectively. Since TiO and $Ti_2O$ were observed continuously after the mixture was supplemented with Ti and $NH_4Cl$ twice, it may be seen that TiO and $Ti_2O$ may be reusable as anti-sintering agents. Therefore, it may be seen that $Ti_2O_3$, TiO, $Ti_2O$, $Ti_3O$, $Ti_6O$, and the like may be used as the anti-sintering agent.

Experimental Example 3

An adhesion test was performed on the electroless Cu plating layer in the case where TiN and TiC were used as anti-sintering agents according to Example 3, and the results are shown in Tables 3 and 4. Referring to Table 3, it was confirmed that higher adhesive force was observed at 1000° C. when TiN was used. Referring to Table 4, it was confirmed that higher adhesive force was observed at 900° C. and 1000° C. when TiC was used. Obviously, the Ti-containing powder was not sintered in both cases.

TABLE 3

| Reaction temperature-time | Ti content in powder mixture (wt %) | Adhesive strength of tape (N/cm) | |
|---|---|---|---|
| | | 2.5 | 44 |
| 900° C.-1 hour | 16 | 5B | 4B |
| 900° C.-4 hours | 16 | 5B | 4B |
| 1,000° C.-1 hour | 16 | 5B | 5B |
| 1,000° C.-4 hours | 16 | 5B | 5B |

TABLE 4

| Reaction temperature-time | Ti content in powder mixture (wt %) | Adhesive strength of tape (N/cm) | |
|---|---|---|---|
| | | 2.5 | 44 |
| 900° C.-1 hour | 16 | 5B | 5B |
| 900° C.-4 hours | 16 | 5B | 5B |
| 1,000° C.-1 hour | 16 | 5B | 5B |
| 1,000° C.-4 hours | 16 | 5B | 5B |

Figure 7A:
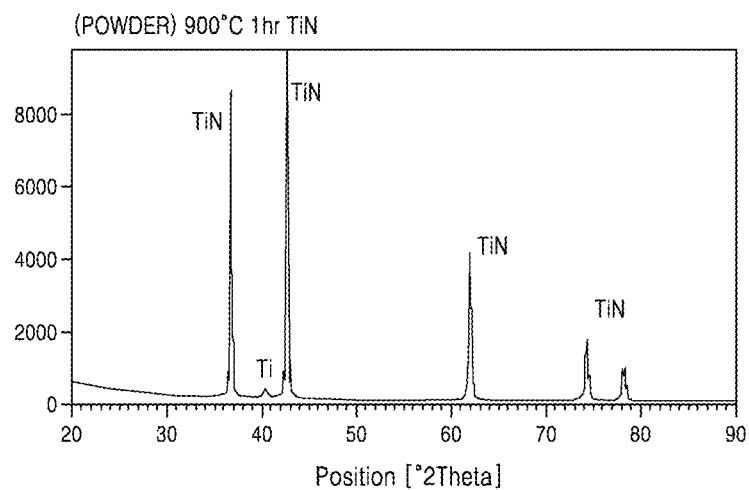
FIG. 7A and FIG. 7B show types of materials formed on a substrate when TiN and TiC powder are added as anti-sintering agents according to an embodiment of the present disclosure.
Figure 7B:
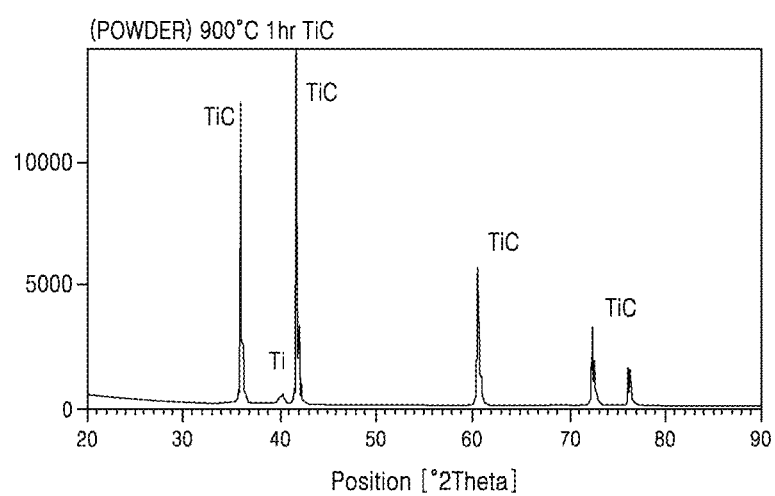

FIG. 7A and FIG. 7B show types of materials formed on a substrate when TiN and TiC powder are added as anti-sintering agents according to Example 3, respectively. In the case of the TiN and TiC powder, almost no side reaction with Ti occurs, and thus they are suitable as the anti-sintering agent.

Figure 8:
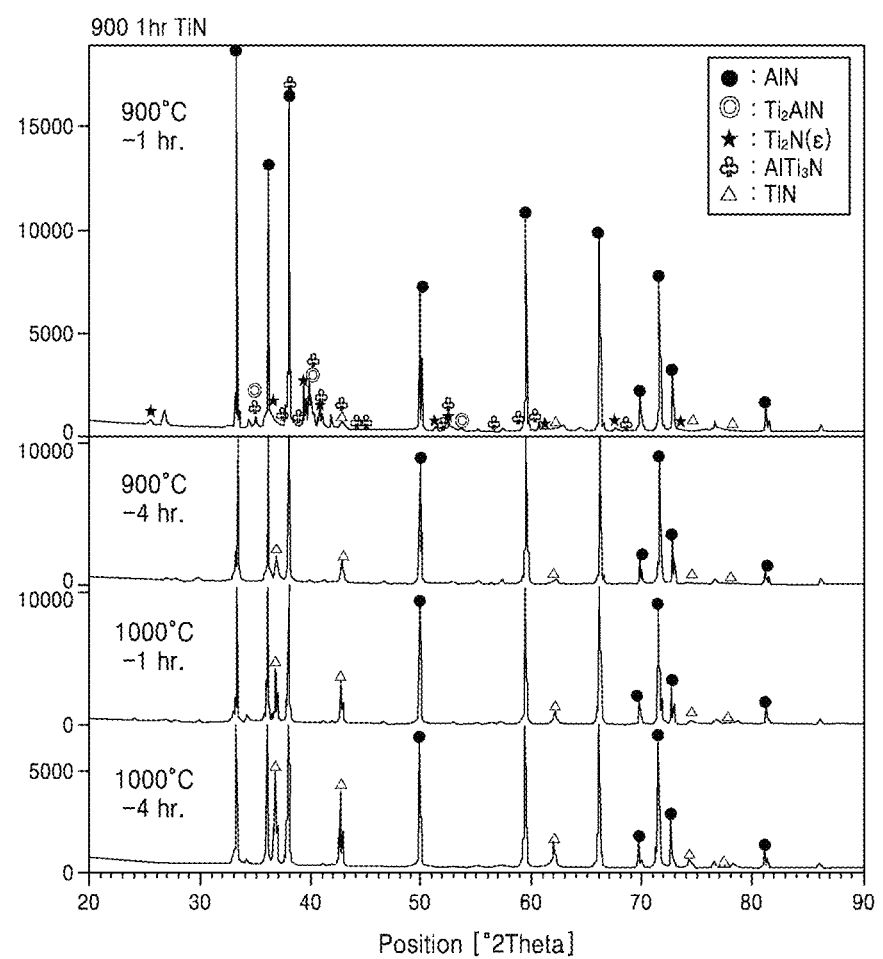
FIG. 8 shows types of materials formed on a substrate when TiN powder is added as an anti-sintering agent according to an embodiment of the present disclosure.

FIG. 8 shows types of materials formed on a substrate when TiN powder is added as an anti-sintering agent according to Example 3. It was confirmed that small amounts of $Ti_2AlN$, $AlTi_3N$, and $Ti_2N$ were generated in addition to TiN.

Figure 9:
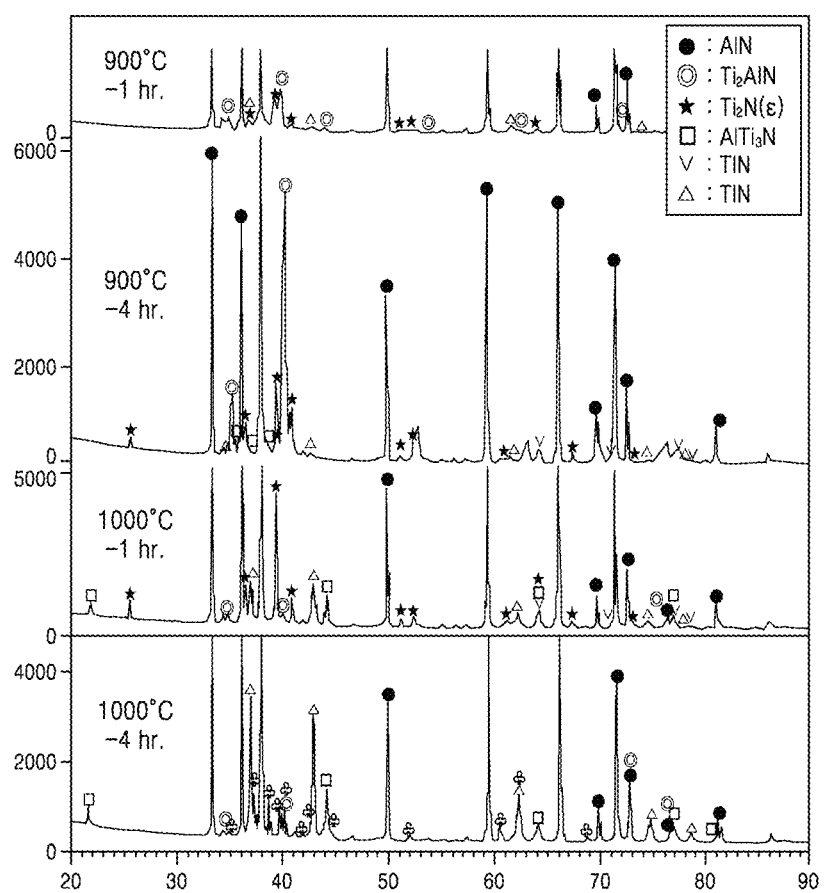
FIG. 9 shows types of materials formed on a substrate when TIC powder is added as an anti-sintering agent according to an embodiment of the present disclosure.

FIG. 9 shows types of materials formed on a substrate when TiC powder is added as an anti-sintering agent according to Example 3. It was confirmed that small amounts of $Ti_2AlN$, $AlTi_3N$, and $Ti_2N$ were generated in addition to TiN and the TiC anti-sintering agent was more effective at a low temperature.

Figure 10:
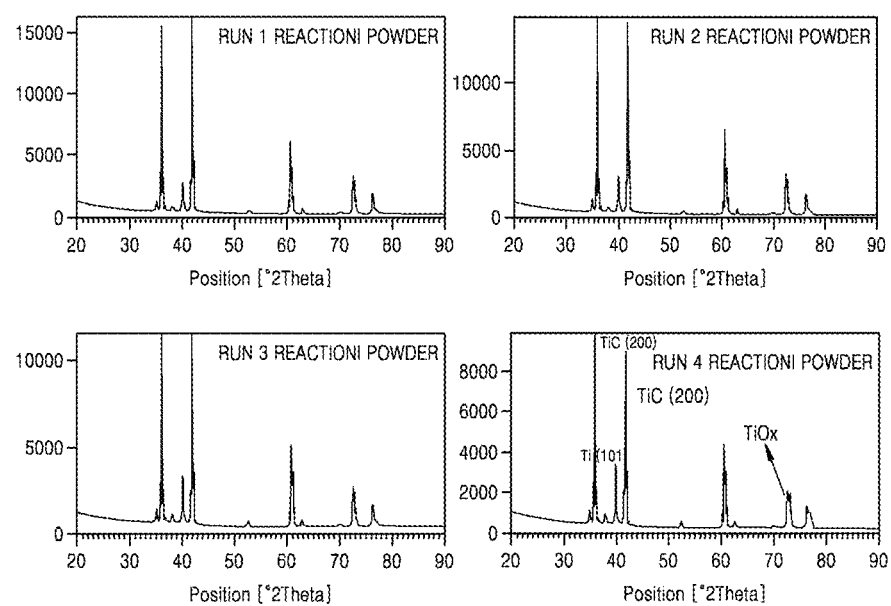
FIG. 10 shows types of materials formed on a substrate when TiC powder is repeatedly used as an anti-sintering agent according to an embodiment of the present disclosure.

FIG. 10 is an X-ray diffraction pattern showing phase distribution of a powder mixture after reaction when TiC powder is repeatedly used as an anti-sintering agent according to an embodiment of the present disclosure. As a result of repeated tests using TiC powder in Example 3, reaction with Ti was relatively low, but oxidation with Ti was observed when the mixture was supplemented with Ti three times (Run 4, fourth test of Example 3). Peak splitting observed at 73° and 76° where the TiC phase appears was caused by $TiO_x$. This indicates that Ti powder may react with oxygen in the art to generate a trace of $TiO_x$ even under an Ar atmosphere. As a result of forming an electroless Cu plating layer on the AlN substrate of Run 2 to Run 4 and testing interfacial adhesive forces using tapes, adhesive forces were evaluated as 5B in both cases of 2.5 N/cm and 44 N/cm. In Run 2, 5 sheets of the AlN substrate were titanized by adding 5% Ti thereto. Run 3 was performed in the same manner as in Run 2. In Run 4, only 2% of Ti was further added.

In the fifth test of Example 3, 12 sheets of the AlN substrate were titanized in a state where Ti was not further added. The adhesive force between the AlN substrate and the Cu plating layer was evaluated as 5B in both cases of 2.5 N/cm and 44 N/cm. Based thereon, it was confirmed the powder mixture may be continuously reused by adding a small amount of Ti. An amount of the added Ti is considered to correspond to an amount required for titanization of the AlN substrate and an amount lost by the reaction with oxygen and moisture in the reactor.

In the sixth test of Example 3, powder to which 5 wt % of Ti was added was used. 6 sheets of the AlN substrate and 4 sheets of the $Si_3N_4$ substrate were titanized at 900° C. for 1 hour. The adhesive forces of the AlN substrate and the $Si_3N_4$ substrate with the Cu layer were strong as 5B in both cases of 2.5 N/cm and 44 N/cm. Under all conditions, the powder mixtures used in titanization were not sintered, and thus the nitride substrate was easily separated after reaction, and sand burning of Ti on the surface of the nitride substrate was not observed.

Figure 11A:
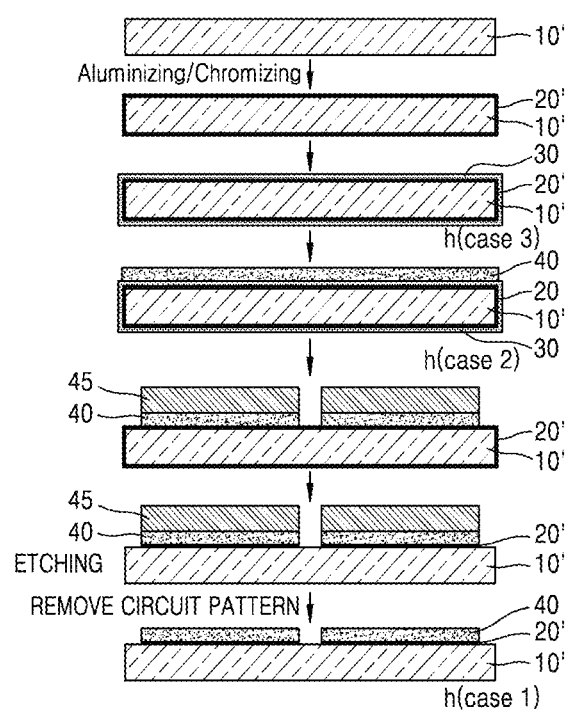
FIG. 11A and FIG. 11B are process flow diagrams illustrating a method for forming a metal pattern on an $Si_3N_4$ substrate according to another embodiment of the present disclosure.
Figure 11B:
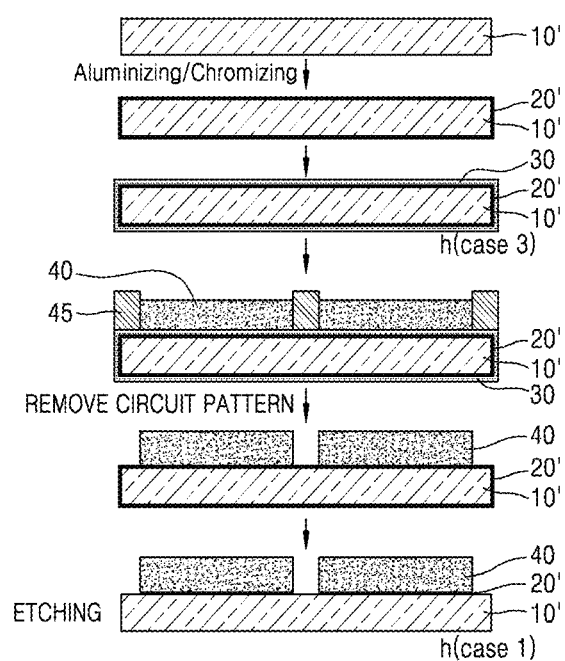

FIG. 11A and FIG. 11B are process flow diagrams illustrating a method for forming a metal pattern on an $Si_3N_4$ substrate according to another embodiment of the present disclosure. In the method for manufacturing a circuit board according to another embodiment of the present disclosure, the metal powder is a metal powder containing Al or Cr, the metal-containing layer is an Al-containing or Cr-containing layer 20', the anti-sintering agent includes $Al_2O_3$, and the dielectric substrate is an $Si_3N_4$ substrate 10'. Referring to FIG. 11A and FIG. 11B, the method for manufacturing a circuit board according to another embodiment starts with a step of forming an Al-containing or Cr-containing layer 20' on the surface of an $Si_3N_4$ substrate 10'. In this case, $Si_3N_4$ constituting the $Si_3N_4$ substrate 10' is a material capable of reacting with Al or Cr.

The Al-containing or Cr-containing layer 20' may be formed by immersing the $Si_3N_4$ substrate 10' in a mixture of a metal powder containing Al or Cr, $Al_2O_3$ and an activator and heating the mixture under an inert atmosphere or under a reducing atmosphere. The metal powder containing Al or Cr may be pure Al powder or pure Cr powder, a mixture of Al powder and Cr powder, or a powder of an Al—Cr alloy. By adding a small amount of Ti thereto, the metal powder containing Al or Cr may be a mixture of Al and Ti powders or a powder of an Al—Ti alloy, a mixture of Cr and Ti powders or a powder of a Cr—Ti alloy, a mixture of Al/Cr/Ti powders, or a powder of an Al—Cr—Ti alloy.

A gaseous compound generated by a reaction of the metal powder containing Al or Cr with the activator migrates onto the surface of the $Si_3N_4$ substrate 10, and Al or Cr metal formed on the surface of the $Si_3N_4$ substrate 10' reacts with a component of the $Si_3N_4$ substrate 10' to form the Al-containing or Cr-containing layer 20'. In the case where Ti is added to the metal powder containing Al or Cr, Ti also migrates onto the $Si_3N_4$ substrate in the same principle to form a reaction layer including Ti and Al, Ti and Cr, or Ti, Al, and Cr.

The $Si_3N_4$ substrate 10' is an example of a substate including a nitride, and examples thereof may include a nitride substrate capable of reacting with a metal generated from the metal powder containing Al or Cr, e.g., one of AlN and BN, in addition to the above-described substrate including $Si_3N_4$.

$Al_2O_3$ is an example of anti-sintering agents for preventing the Al or Cr metal powder from being sintered. Examples of the anti-sintering agent may include a ceramic material, e.g., MgO powder, having inert properties with little reactivity with the metal powder containing Al or Cr at a high temperature in addition to the above-described $Al_2O_3$.

As the activator, at least one selected from the group consisting of a chloride, a fluoride, and an iodide may be used. As the chloride, at least one selected from a chloride of an alkali metal such as LiCl, NaCl, and KCl, and a chloride of an alkali earth metal such as $CaCl_2$ and $BaCl_2$, and $NH_4Cl$ may be used. As the fluoride, at least one selected from the group consisting of NaF, KF, LiF, $MgF_2$, $CaF_2$, $BaF_2$, and $NH_4F$ may be used. As the iodide, at least one selected from the group consisting of NaI, KI, LiI, $MgI_2$, $CaI_2$, $BaI_2$, and $NH_4I$ may be used.

In an embodiment of the present disclosure, the activator may be used in an amount of 0.1 to 10 parts by weight based on 100 parts by weight of the metal powder containing Al or Cr. When the amount of the activator is less than 0.1 parts by weight, an Al-containing or Cr-containing gaseous phase generated via a reaction with Al or Cr is low. When the amount of the activator is greater than 10 parts by weight, inconvenience may be caused in post-processing.

In an embodiment of the present disclosure, the inert atmosphere may be prepared using at least one of argon gas and nitrogen gas and the reducing atmosphere may be prepared using at least one of hydrogen gas and ammonia gas. In an embodiment of the present disclosure, when Al or Cr is precipitated on the surface of $Si_3N_4$ and induces a reaction, an Al-containing or Cr-containing nitride and an alloy phase containing Al or Cr and Si are generated. For example, when the power mixture including Al or Cr powder and a chloride activator is heated, Al or Cr reacts with the chloride activator to form an Al— or Cr-chloride-containing gaseous phase. The Al— or Cr-chloride-containing gaseous phase is brought into contact with the surface of $Si_3N_4$ to be precipitated into Al or Cr, and the precipitated Al or Cr reacts with Si and nitrogen (N), which are components of $Si_3N_4$ to form an alloy with an Al— or Cr-containing nitride such as AlN, CrN, $Cr_2N$, and AlCrN. That is, the Al chloride or Cr chloride in the gaseous phase reacts with $Si_3N_4$ in the solid phase to form a coating layer on the surface of $Si_3N_4$. Since the Al-containing or Cr-containing layer 20' including an Al chloride or Cr chloride and an Al nitride or Cr nitride is formed via such gas-solid phase reaction, the Al-containing or Cr-containing layer 20' may be uniformly formed on the surface of $Si_3N_4$. In the case of using an $Si_3N_4$ substrate, compounds such as AlN or CrN, Al—Si alloy or Cr—Si alloy may be generated as reactants.

Figure 12:
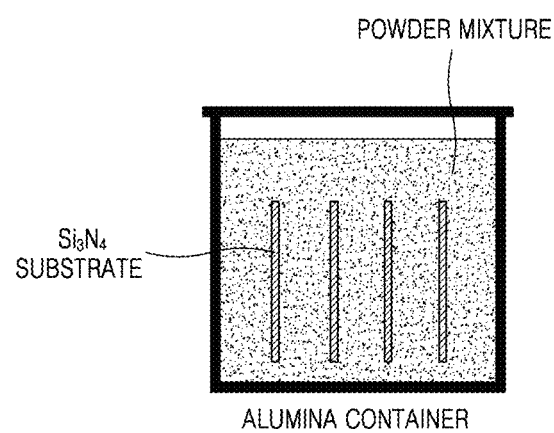
FIG. 12 is a schematic diagram illustrating a process of forming an Al/Cr-containing layer on a substrate in an alumina container according to an embodiment of the present disclosure.

FIG. 12 is a schematic diagram illustrating a process of forming an Al/Cr-containing layer on a substrate in an alumina container according to an embodiment of the present disclosure.

Referring to FIG. 12, a substrate is immersed in a mixture of a metal powder containing Al or Cr, $Al_2O_3$, and an activator and heated under an inert atmosphere or under a reducing atmosphere to form an Al-containing or Cr-containing layer on the substrate. In this case, an anti-sintering agent may be added to prevent particles of the metal powder containing Al or Cr from being sintered and increase adhesive force with a plating layer. The anti-sintering agent is a material having inert properties with little reactivity at a high temperature, and alumina ($Al_2O_3$) may be used.

When $Al_2O_3$ is not added to the powder mixture, the metal powder containing Al or Cr is partially sintered as the heat treatment temperature increases so that it is difficult to separate the $Si_3N_4$ substrate after heat treatment and a sand burning of the sintered metal powder occurs partially on the surface of the $Si_3N_4$ substrate 10'. This remains in the subsequent electroless plating process of Cu, and thus an electroless plating layer having a rough surface is formed, thereby decreasing a value as a nitride circuit board. Therefore, in order to prevent the metal powder containing Al or Cr from being sintered and form a uniform reaction layer on the surface of $Si_3N_4$, it is important to add $Al_2O_3$ as the anti-sintering agent. Particularly, when pure Al powder having a low melting point of 650° C. is added, $Al_2O_3$ is necessary in a reaction at a higher temperature than a melting point.

Therefore, in an embodiment of the present disclosure, by adding the $Al_2O_3$ anti-sintering agent to the metal powder mixture containing Al or Cr, sintering of particles of Al or Cr powder may be prevented and adhesive force with the plating layer may be significantly increased.

An Al-containing or Cr-containing reaction layer was formed on the $Si_3N_4$ substrate by using 1 to 40 wt % of a metal powder containing Al or Cr, 0.1 to 10 wt % of an activator (relative to the metal powder), and the remainder of $Al_2O_3$. When the amount of the metal powder is less than 1 wt %, a non-uniform reaction layer is formed on the $Si_3N_4$ substrate. When the amount of the metal powder is greater than 40 wt %, the powder mixture is sintered after reaction is performed at a high temperature.

Subsequently, an electroless plating layer 30 including Cu, Ni, Co, Au, Pd, or an alloy thereof and an electroplating layer 40 including Cu, Ni, Fe, Co, Cr, Zn, Au, Ag, Pt, Pd, Rh, or an alloy thereof are sequentially formed on the Al-containing or Cr-containing layer 20'. In the specification of the present disclosure, the sequentially stacked electroless plating layer 30 and electroplating layer 40 are collectively referred to as 'plating layer'. The plating layers on the $Si_3N_4$ substrate 10' coated with the Al-containing or Cr-containing layer 20' may be in a form covering the entire $Si_3N_4$ substrate 10' or may have a desired pattern. Wiring corresponding to a given pattern may be formed by an etching process or a semi-additive process.

According to the technical idea of the present disclosure, at least one heat treatment is performed after the Al-containing or Cr-containing layer 20' is formed to increase binding force between the Al-containing or Cr-containing layer 20' and the plating layers 30 and 40 by mutual diffusion. For example, the heat treatment may be performed during a process of forming the plating layers 30 and 40 or after forming the metal pattern using the plating layers 30 and 40.

FIG. 11A and FIG. 11B schematically show methods of manufacturing circuit boards by the etching process and the semi-additive process to form a metal pattern on the $Si_3N_4$ substrate, respectively according to another embodiment of the present disclosure.

The etching process of FIG. 11A is used when the plating layers are not thick and a metal pattern is obtained by attaching a desired film of the circuit pattern 45 to the electroless plating-electroplating layers and removing portions other than the circuit pattern 45 by etching. The heat treatment process to further improve adhesive force between the Ti-containing layer 20 and the plating layer may be introduced after the metal pattern is obtained (case 1) or before etching the plating layers, i.e., before attaching the film of the circuit pattern 45 (case 2). Also, after the first metal layer is formed by electroless plating and heat-treated, the second metal layer may be formed by electroplating (case 3).

The purpose of introducing the heat treatment process is to increase binding force between the plating layers 30 and 40 and the Al-containing or Cr-containing layer 20' by mutual diffusion, and thus the heat treatment process may be applied at any stage of the entire process.

According to the semi-additive process of FIG. 11B, after the Al-containing or Cr-containing layer 20' and the electroless plating layer 30 are formed on the $Si_3N_4$ substrate 10', the circuit pattern 45 is attached to a region of the $Si_3N_4$ substrate 10' provided with the electroless plating layer 30. Subsequently, the electroplating layer 40 is formed on a non-circuit pattern region, and the previously formed circuit pattern 45 is removed, and then the Al-containing or Cr-containing layer 20' formed on the surface of the $Si_3N_4$ substrate 10' is etched to form the metal pattern. The heat treatment process may also be introduced at any appropriate stage of the semi-additive process in accordance with the principle.

In an embodiment of the present disclosure, in the process of forming the metal pattern, the etching of the plating layer may be performed using any known etchant. In addition, any known etchant capable of etching Al or Cr may be used in the etching of the Al-containing or Cr-containing layer 20'.

In an embodiment of the present disclosure, a heat treatment temperature may be from 400 to 1000° C. Since a thickness of the Al-containing or Cr-containing layer 20' is generally about several micrometers (µm), the heat treatment time may preferably be from 0.1 minutes to 600 minutes, more preferably, from 0.1 minutes to 120 minutes. By adjusting the heat treatment temperature or time, the degree of mutual diffusion may be controlled. In this case, the heat treatment may be performed under a weakly reducing atmosphere to inhibit oxidation of the metal.

In an embodiment of the present disclosure, the electroless plating layer 30 or the first metal layer 30 formed by electroless plating may include one of Cu, Ni, Co, Au, or Pd or an alloy thereof. The electroless plating may be performed by any known method, e.g., a method of using Pd as a catalyst. Conditions for the electroless plating may be appropriately adjusted in accordance with a required thickness for the plating layer.

After the first metal layer is formed, the electroplating layer 40 or the second metal layer 40 is formed by electroplating. The second metal layer 40 may include Cu, Ni, Fe, Co, Cr, Zn, Au, Ag, Pt, Pd, Rh, or an alloy thereof. The electroplating of the second metal layer 40 may also be performed by any known method.

The second metal layer 40 including alloys having various compositions in accordance with purposes of the circuit board may be used as an example of the present disclosure.

In an embodiment of the present disclosure, when an Fe—Ni alloy layer is formed as the second metal layer 40, a thermal expansion coefficient may be lowered to a level of a ceramic material by adjusting the composition of the alloy layer, and the second metal layer 40 may be used as a high-temperature heating material. For example, an Fe—Ni alloy layer having an INVAR alloy composition including 36 wt % of Ni, the remainder of Fe, and inevitable impurities is formed, a circuit board including a metal layer having a very low thermal expansion coefficient may be manufactured. As another example, the Fe—Ni alloy layer may be used as a high-temperature heating material.

In an embodiment of the present disclosure, when a Ni—Cr alloy layer is formed as the second metal layer 40, the second metal layer 40 may be used as a heating material. For example, a nichrome alloy layer including 80 wt % of Ni and 20 wt % of Cr is used as the substate, it may be used as a planar heater.

In an embodiment of the present disclosure, by locally forming the Fe—Ni alloy layer or the Ni—Cr alloy layer, which generate heat, on a portion of the circuit board as the second metal layer 40, the portion may be locally heated. Such a circuit board having a locally heating property may be applied to a sensor circuit that operates at a high temperature. For example, by forming Ni—Cr alloy wiring in the middle of Cu wiring, heat may be generated only at the portion of the Ni—Cr wiring.

In an embodiment of the present disclosure, a soft magnetic thin-film including at least one of Fe, Ni, and Co is formed as the second metal layer 40 so as to be used for various purposes as a magnetic element or a magnetic sensor.

Meanwhile, according to a method for manufacturing a circuit board according to another embodiment of the present disclosure, a layer of Al, Cu, Fe, Ni, Co, Cr, Zn, Au, Pd, or an alloy thereof may be formed on a $Si_3N_4$ substrate including an Al-containing or Cr-containing layer by brazing. Since there is a limit on increasing thickness of the metal layer by electroless plating and electroplating, and thus it is more economical to use any other methods to form a metal layer to several tens of micrometers or more. Also, brazing is used to join a metal, which cannot be formed by electroplating, to $Si_3N_4$. In this method, a metal layer having several hundred to several thousand micrometers may be formed on the $Si_3N_4$ substrate. In addition, an Al layer or a stainless-steel layer, which cannot be formed by electroplating, may be formed thereon. A case of forming an Al layer will be described. As a brazing material, an Al(7 to 12 wt %)-Si alloy powder, paste, or plate was placed on the Al-containing or Cr-containing layer, and an Al plate was placed thereon. A pressure of 0.01 to 1 MPa was applied between the Al plate having a thickness of several hundred to several thousand micrometers and the $Si_3N_4$ substrate and the structure was placed in a furnace. The joining was performed in a vacuum or non-oxidizing atmosphere at a temperature of 550 to 630° C. While all or a part of the brazing material is melted, joining to the reaction layer containing Al or Cr occurs and joining to the Al plate also occurs. Various metals may be joined using methods of changing the brazing material and joining temperature in accordance with the type of the metal plate to be joined. Once the metal to be joined is determined, a brazing material suitable therefor is determined. For example, a low-melting point brazing material based on Ag—Cu—Zn is used to join a metal such as Cu, Ag, and Ni and brazing is performed in a temperature range of 650 to 900° C. A thick circuit board may be used as a heat dissipation substrate, a plate heating element, or the like.

Hereinafter, the present disclosure will be described in more detail with reference to the following examples. However, the following examples are merely presented to exemplify the present disclosure, and the scope of the present disclosure is not limited thereto.

EXAMPLES

Example 4

Aluminizing 2 to 30 wt % of an Al powder, 3 wt % (relative to the weight of Al) of a $NH_4Cl$ powder, and the remainder of an $Al_2O_3$ powder were weighed and mixed to prepare a powder mixture. 4 types of powder mixtures respectively including 2 wt %, 8 wt %, 15 wt %, and 30 wt % of Al were prepared and tested according to the following method. Each powder mixture was added to an alumina crucible with a capacity of 50 cm$^3$, 4 sheets of an $Si_3N_4$ substrate was immersed in the mixture, and the mixture was heated under an Ar gas atmosphere at 900° C. for 1 hour. The $Si_3N_4$ substrate had a width and a length of 2.5 cm and a thickness of 1 mm was used. After reaction, the $Si_3N_4$ substrate was easily recovered from the powder mixture. This indicates that Al is present in a non-sintered state in the powder mixture under the reaction conditions as described above.

In addition, aluminization was performed using 2 types of powder mixtures having Al contents of 15 wt % and 30 wt % at 600° C. for 1 hour. After forming an Al-containing reaction layer on the surface, an electroless Cu plating layer was formed thereon, and then adhesive force of the electroless Cu plating layer was evaluated. An adhesion test using adhesive tapes was performed on the electroless Cu plating layer. 10×10 lattices each having a size of 1 mm×1 mm was formed on the electroless Cu plating layer. After a tape is applied to the electroless Cu plating layer of the substrate and removed therefrom, a ratio of peeled off lattices was measured and assessed on a 0B-5B scale. (5B: The cut surface is clean and no lattice is removed. 4B: Small pieces of the coating are separated at intersections (less than 5% of lattice area). 3B: Small pieces of the coating are separated at intersections of cut portions along corners (5 to 15% of lattice area). 2B: Edges of a cut surface of the coating and parts of lattices are separated (15 to 35% of lattice area). 1B: Edges of a cut surface of the coating are peeled off in a large area and lattices are separated (35 to 65% of lattice area). 0B: More peeled off and more separated than 1B (65% or more of lattice area)). In a test using 2 types of adhesive tapes having adhesive strengths of 2.5 N/cm and 44 N/cm, it was confirmed that all of the electroless Cu plating layers formed on the $Si_3N_4$ substrate prepared under the reaction conditions were firmly adhered without being peeled off.

Figure 13A:
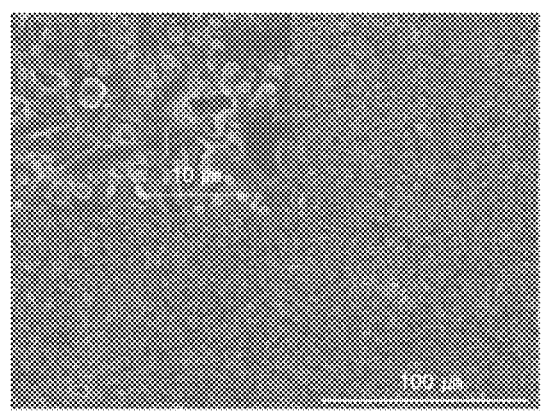
FIG. 13A and FIG. 13B show SEM images of surfaces of $Si_3N_4$ substrates aluminized according to an embodiment of the present disclosure.
Figure 13B:
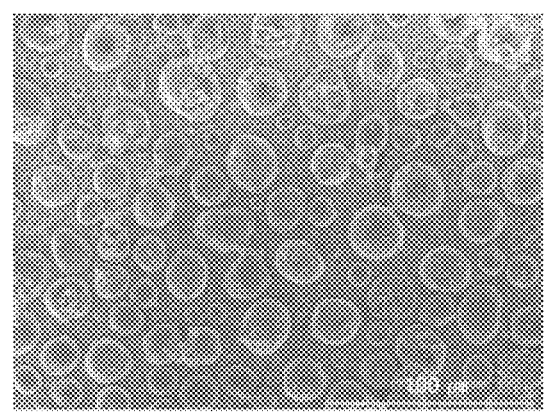
Figure 14:
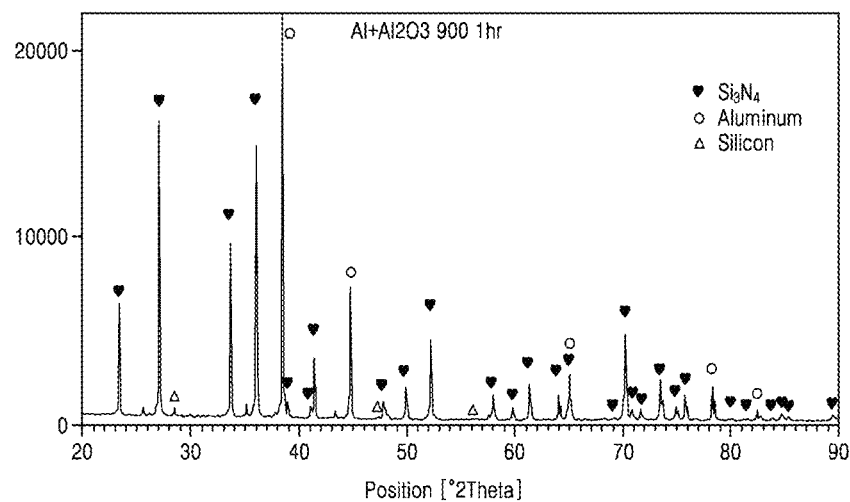
FIG. 14 shows an X-ray diffraction pattern of phases formed on the surface of an $Si_3N_4$ substrate aluminized according to an embodiment of the present disclosure.

Meanwhile, FIG. 13A and FIG. 13B show SEM images of surfaces of $Si_3N_4$ substrates aluminized using a powder mixture containing 15 wt % of Al. The image of FIG. 13A was obtained by reaction at 600° C. for 1 hour and FIG. 13B was obtained by reaction at 900° C. for 1 hour. In addition, FIG. 14 shows an X-ray diffraction pattern of a reaction layer obtained by reaction at 900° C. for 1 hour. In the X-ray diffraction pattern, Al and Si phases are detected indicating that Al generated reacts with $Si_3N_4$ on the surface of the $Si_3N_4$ substrate to form AlN and an Al—Si (high Al content). The shape of the Al-containing reaction layer is hemispherical as shown in FIG. 13A and FIG. 13B. A height measured using a micrometer was 2 to 3 μm by the reaction at 600° C. for 1 hour and 8 to 9 μm by the reaction at 900° C. for 1 hour.

Example 5

Chromizing 8 to 30 wt % of a Cr powder, 3 wt % (relative to the weight of Cr) of a $NH_4Cl$ powder, and the remainder of an $Al_2O_3$ powder were weighed and mixed to prepare a powder mixture. 3 types of powder mixtures respectively including 8 wt %, 15 wt %, and 30 wt % of Cr were prepared and tested according to the following method. Reaction conditions included at 900° C. for 1 hour or at 1,000° C. for 4 hours. The other conditions are the same as those of Example 7. In a test using 2 types of adhesive tapes having adhesive strengths of 2.5 N/cm and 44 N/cm, it was confirmed that all of the electroless Cu plating layers were firmly adhered on the $Si_3N_4$ substrate prepared under the reaction conditions described above without being peeled off.

Figure 15:
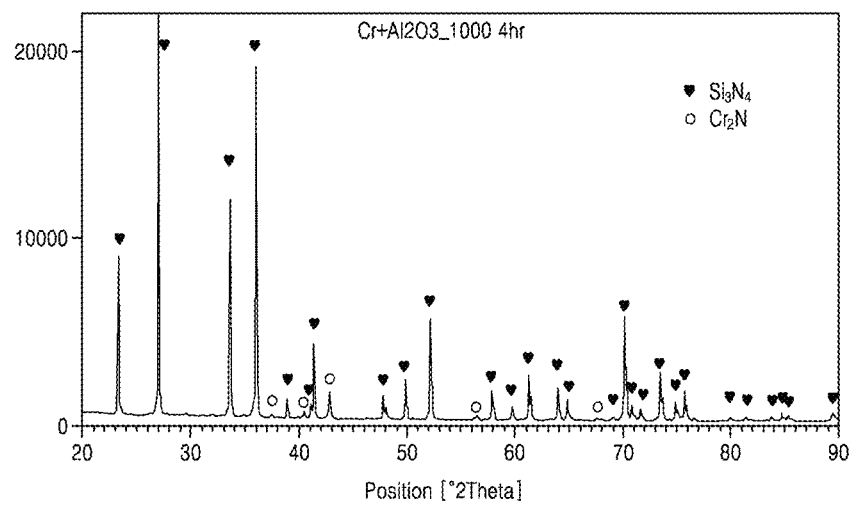
FIG. 15 shows an X-ray diffraction pattern of phases formed on the surface of an $Si_3N_4$ substrate chromized according to an embodiment of the present disclosure.

Meanwhile, FIG. 15 shows an X-ray diffraction pattern of a $Si_3N_4$ substrate chromized at 1,000° C. for 4 hours using the powder mixture containing 15 wt % of Cr. Since a $Cr_2N$ phase was detected in the X-ray diffraction pattern, it was confirmed that Cr generated on the surface of the substrate reacts with $Si_3N_4$ to form $Cr_2N$ and a Cr—Si alloy.

Example 6

Aluminizing and Chromizing 5 wt % of an Al powder, 10 wt % of a Cr powder, 3 wt % (relative to a weight of Al+Cr) of a $NH_4Cl$ powder, and the remainder of $Al_2O_3$ powder were weighed and mixed to prepare a powder mixture. A reaction layer including both Al and Cr was formed on the $Si_3N_4$ substrate via reaction using the powder mixture at 900° C. for 1 hour. The other process was the same as that of Example 4. In a test using 2 types of adhesive tape having adhesive strengths of 2.5 N/cm and 44 N/cm, it was confirmed that the electroless Cu plating layers were firmly adhered without being peeled off.

Example 7

Aluminizing and Titanizing

The test was performed in the same manner as Example 6, except that a powder mixture including 10 wt % of an Al powder, 5 wt % of a Ti powder, 3 wt % (relative to a weight of Al+Ti) of a $NH_4Cl$ powder, and the remainder of an $Al_2O_3$ powder was used. In a test using tapes having adhesive strengths of 2.5 N/cm and 44 N/cm, it was confirmed that the electroless Cu plating layers were firmly adhered without being peeled off.

Example 8

Adhesion of Metal Layer by Brazing

An Al-12 wt % brazing paste was spread on the surface of a substrate aluminized at 900° C. for 1 hour in Example 4 to a thickness of 20 μm and an Al plate having a thickness of 1 mm was placed thereon, followed by brazing at 600° C. in a vacuum furnace driven by a rotary pump. In order to evaluate durability of the obtained layered composite, a test was performed 10 cycles, each cycle performed at 300° C.-5 minutes, at room temperature-5 minutes, in dry ice-5 minutes, and at room temperature-5 minutes. As a result, it was confirmed that the layers were firmly joined.

According to the embodiments of the present disclosure as descried above, the substrate on which the Ti-containing layer is formed is easily separated and a circuit board having improved adhesive force between the substrate and the plating layer may be easily manufactured.

In addition, according to the embodiments of the present disclosure as descried above, the $Si_3N_4$ substrate may be easily separated even after forming the Al-containing or Cr-containing layer using a relatively inexpensive aluminum/chromium and a circuit board having improved adhesive force between the substrate and the plating layer may be easily manufactured.

However, it is obvious that the scope of the present disclosure is not limited by these effects.

According to the embodiments of the present disclosure as described above, flexible nanostructured film connected in three dimensions having various sizes may be formed on surfaces of stents formed of various materials by a bottom-up method using the ionic surfactant and the auxiliary spacer under chemically mild conditions.

What is claimed is:

1. A method for manufacturing a circuit board, the method comprising:
    (a) preparing a mixture of a metal powder, an anti-sintering agent, and an activator;
    (b) immersing a dielectric substrate in the mixture;
    (c) forming a metal-containing layer on the surface of the dielectric substrate by heating the mixture under an inert atmosphere or under a reducing atmosphere;
    (d) forming a first metal layer on the metal-containing layer by electroless plating and forming a second metal layer thereon by electroplating; and
    (e) forming a metal pattern on the dielectric substrate, wherein
    the first metal layer comprises Cu, Ni, Co, Au, Pd, or an alloy thereof,
    the second metal layer comprises Cu, Ni, Fe, Co, Cr, Zn, Au, Ag, Pt, Pd, Rh, or an alloy thereof,
    the anti-sintering agent comprises $Ti_xO_y$, wherein X>y, TiN, TIC, or a combination thereof, and
    the method further comprises performing heat treatment at least once after step (c).

2. The method of claim 1, wherein the metal powder is a Ti powder, and the metal-containing layer is a Ti-containing layer.

3. The method of claim 2, wherein the anti-sintering agent further comprises $Al_2O_3$, $TiO_2$, MgO, or a combination thereof.

4. The method of claim 3, wherein the anti-sintering agent is in a form of a powder.

5. The method of claim 2, wherein the mixture comprises 2% to 32% of the Ti powder, 0.04% to 0.64% of the activator, and the remainder of the anti-sintering agent based on a total weight of the mixture.

6. The method of claim 2, wherein the heating of step (c) is performed at a temperature of 700° C. to 1200° C.

7. The method of claim 2, the activator is used in an amount of 0.1 parts by weight to 20 parts by weight based on 100 parts by weight of the Ti powder.

8. The method of claim 2, wherein the dielectric substrate is a nitride.

9. The method of claim 8, wherein the nitride comprises one of AlN, $Si_3N_4$, and BN.

10. The method of claim 1, wherein the metal powder is an Al-containing or Cr-containing metal powder,
the metal-containing layer is an Al-containing or Cr-containing layer,
the anti-sintering agent comprises $Al_2O_3$, and
the dielectric substrate is a $Si_3N_4$ substrate.

11. The method of claim 10, wherein the heating of step (c) is performed at a temperature of 500° C. to 1200° C.

12. The method of claim 10, wherein the activator is used in an amount of 0.1 parts by weight to 20 parts by weight based on 100 parts by weight of Al or Cr powder.

13. The method of claim 1, wherein the performing of heat treatment comprises heat-treating the dielectric substrate on which the metal pattern is formed after step (e).

14. The method of claim 1, wherein the performing of heat treatment comprises heat-treating the dielectric substrate on which the second metal layer is formed after step (d) and before step (e).

15. The method of claim 1, wherein the performing of heat treatment is performed by heat-treating the dielectric substrate after the electroless plating in step (d) and then the second metal layer is formed by electroplating.

16. The method of claim 1, wherein the second metal layer comprises an Fe—Ni alloy layer or an Ni—Cr alloy layer.

17. The method of claim 16, wherein the Fe—Ni alloy layer comprises an INVAR alloy.

18. The method of claim 16, wherein the Ni—Cr alloy layer comprises a nichrome alloy.

19. The method of claim 1, wherein the second metal layer comprises a soft magnetic thin-film formed of at least one of Fe, Ni, and Co.

20. The method of claim 1, wherein the activator comprises at least one selected from the group consisting of a chloride, a fluoride, and an iodide.

21. The method of claim 20, wherein
the chloride is at least one selected from the group consisting of NaCl, KCl, LiCl, $CaCl_2$), $BaCl_2$, and $NH_4Cl$,
the fluoride is at least one selected from the group consisting of NaF, KF, LiF, $MgF_2$, $CaF_2$, $BaF_2$, and $NH_4F$, and
the iodide is at least one selected from the group consisting of NaI, KI, LiI, $MgI_2$, $CaI_2$, $BaI_2$, and $NH_4I$.

22. The method of claim 1, wherein a heating time in step (c) is from 0.1 minutes to 120 minutes.

23. The method of claim 1, wherein a heating temperature is from 400° C. to 1000° C.

24. The method of claim 1, wherein a heating time is from 0.1 minutes to 120 minutes.

25. The method of claim 1, wherein the heating is performed under a reducing atmosphere.

* * * * *